US012386342B2

United States Patent
Liu et al.

(10) Patent No.: US 12,386,342 B2
(45) Date of Patent: Aug. 12, 2025

(54) HOLISTIC ANALYSIS OF MULTIDIMENSIONAL SENSOR DATA FOR SUBSTRATE PROCESSING EQUIPMENT

(71) Applicant: Applied Materials, Inc., Santa Clara, CA (US)

(72) Inventors: Chao Liu, Singapore (SG); Yudong Hao, Fremont, CA (US); Shifang Li, Pleasanton, CA (US); Andreas Schulze, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 384 days.

(21) Appl. No.: 17/742,332

(22) Filed: May 11, 2022

(65) Prior Publication Data

US 2023/0367302 A1     Nov. 16, 2023

(51) Int. Cl.
*H01L 21/67* (2006.01)
*G05B 19/418* (2006.01)
(Continued)

(52) U.S. Cl.
CPC .......... *G05B 19/41885* (2013.01); *G05B 2219/33034* (2013.01); *G06F 18/20* (2023.01);
(Continued)

(58) Field of Classification Search
None
See application file for complete search history.

(56) References Cited

U.S. PATENT DOCUMENTS 6,912,433 B1 * 6/2005 Chong ............. G05B 19/41875
700/110
6,925,347 B1 * 8/2005 Miller ............. G05B 19/41875
700/121
(Continued)

FOREIGN PATENT DOCUMENTS

TW     201250484 A  * 12/2012
TW     202341307 A  * 10/2023
(Continued)

OTHER PUBLICATIONS

Chen et al., "Equipment Anomaly Detection for Semiconductor Manufacturing by Exploiting Unsupervised Learning from Sensory Data", Jul. 2020, Sensors 2020, 20, 5650; doi:10.3390/s20195650. (Year: 2020).*

(Continued)

*Primary Examiner* — Mohammad Ali
*Assistant Examiner* — Kelvin Booker
(74) *Attorney, Agent, or Firm* — Lowenstein Sandler LLP

(57) ABSTRACT

A method includes receiving, by a processing device, first data. The first data includes data from one or more sensors of a processing chamber and is associated with a processing operation. The first data is resolved in at least two dimensions, one of which is time. The method further includes providing the first data to a model. The method further includes receiving from the model second data. The second data includes an indication of an evolution of a processing parameter during the processing operation. The method further includes causing performance of a corrective action in view of the second data.

20 Claims, 6 Drawing Sheets

Figure 1:
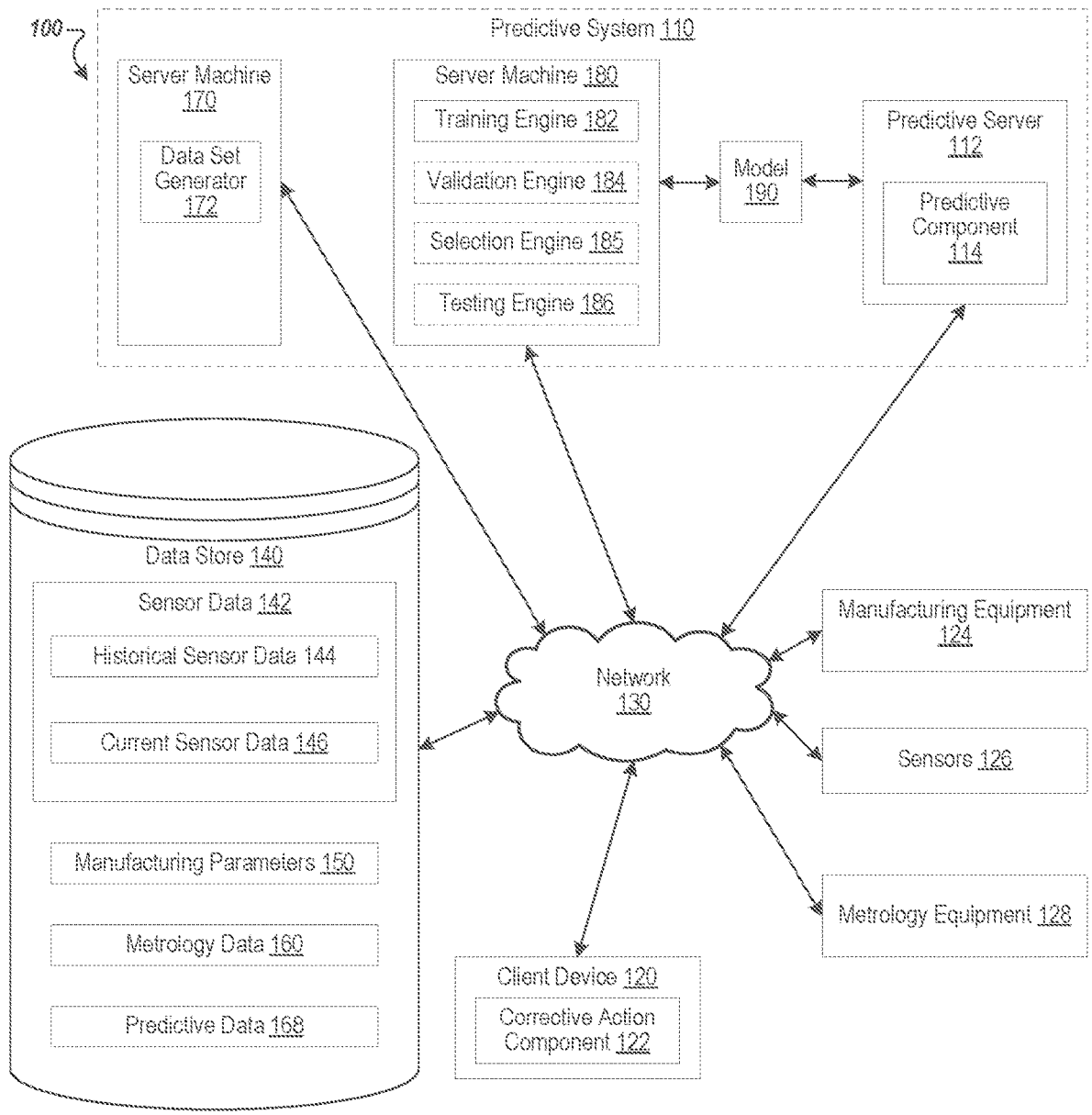

(51) Int. Cl.
*G06F 18/20* (2023.01)
*G06F 18/23* (2023.01)
*G06N 20/20* (2019.01)
*G06N 20/00* (2019.01)

(52) U.S. Cl.
CPC .............. *G06F 18/23* (2023.01); *G06N 20/00* (2019.01); *G06N 20/20* (2019.01); *H01L 21/67* (2013.01)

(56) References Cited

U.S. PATENT DOCUMENTS

| | | | |
|---|---|---|---|
| 7,581,140 B1* | 8/2009 | Pasadyn | G05B 19/41875 714/37 |
| 10,262,910 B2 | 4/2019 | Feng et al. | |
| 10,896,833 B2* | 1/2021 | Kommisetti | G06T 7/001 |
| 11,263,737 B2* | 3/2022 | Sawlani | G06T 7/0004 |
| 2006/0100825 A1* | 5/2006 | Furuya | H01L 21/67288 702/185 |
| 2006/0180570 A1 | 8/2006 | Mahoney | |
| 2010/0076729 A1* | 3/2010 | Davis | H01L 21/67276 702/184 |
| 2018/0061721 A1* | 3/2018 | Khaja | H01L 22/26 |
| 2018/0082826 A1* | 3/2018 | Guha | H01J 37/32082 |
| 2019/0341285 A1* | 11/2019 | Gadre | H01L 21/67288 |
| 2019/0348312 A1* | 11/2019 | Kommisetti | G05B 19/41875 |
| 2020/0110390 A1* | 4/2020 | Banna | G05B 19/41875 |
| 2021/0157228 A1* | 5/2021 | Sriraman | G03F 1/70 |
| 2021/0166120 A1* | 6/2021 | Tsutsui | H01L 21/67253 |
| 2021/0166121 A1* | 6/2021 | Tsutsui | G06N 3/08 |
| 2022/0005713 A1* | 1/2022 | Lu | G06N 3/08 |
| 2022/0037216 A1* | 2/2022 | Lianto | H01L 21/31053 |
| 2022/0066411 A1* | 3/2022 | Ummethala | G06N 3/08 |
| 2022/0122865 A1* | 4/2022 | Santhanam | G05B 19/406 |
| 2022/0129698 A1* | 4/2022 | Moradian | G06F 18/24 |
| 2022/0214662 A1* | 7/2022 | Panda | H01L 21/67276 |

FOREIGN PATENT DOCUMENTS

| | | |
|---|---|---|
| WO | WO-03060779 A1 * | 7/2003 |
| WO | WO-2019195481 A1 * | 10/2019 |
| WO | WO-2020146708 A1 * | 7/2020 |

OTHER PUBLICATIONS

Bleakie et al., Feature extraction, condition monitoring, and fault modeling in semiconductor manufacturing systems, Dec. 2011, Computers in Industry 64 (2013) 203-213. (Year: 2011).*

Zhu et al., "Cross-Chamber Data Transferability Evaluation for Fault Detection and Classification in Semiconductor Manufacturing", Jul. 2022, IEEE Transactions on Semiconductor Manufacturing, vol. 36, No. 1, Feb. 2023. (Year: 2022).*

Liu, Y., "Predictive Modeling for Intelligent Maintenance in Complex Semiconductor Manufacturing Processes", 2008, University of Michigan, dissertation Doctor of Philosophy in Mechanical Engineering. (Year: 2008).*

Limanond et al., "Monitoring and Control of Semiconductor Manufacturing Processes", Dec. 1998, IEEE Control Systems. (Year: 1998).*

Fan et al., "Data-Driven Approach for Fault Detection and Diagnostic in Semiconductor Manufacturing", Feb. 2020, IEEE Transactions on Automation Science and Engineering, vol. 17, No. 4, Oct. 2020. (Year: 2020).*

Kim et al., "Machine Learning-Based Process-Level Fault Detection and Part-Level Fault Classification in Semiconductor Etch Equipment", Feb. 2022, IEEE Transactions on Semiconductor Manufacturing, vol. 35, No. 2, May 2022. (Year: 2022).*

Guerra, S., "A Template Modeling for an Assembly Control—The Source Chamber Alignment", Sep. 2007, Massachussets Institute of Technology. (Year: 2007).*

Akidau et al., "The Dataflow Model: A Practical Approach to Balancing Correctness, Latency, and Cost in Massive Scale, Unbounded, Out of Order Data Processing", 2015, Proceedings of the VLDB Endowment, vol. 8, No. 12. (Year: 2015).*

Barna et al., "MMST Manufacturing Technology—Hardware, Sensors, and Processes", Aug. 1993, IEEE Transactions on Semiconductor Manufaciwring, vol. 7, No. 2, May 1994. (Year: 1993).*

* cited by examiner

HOLISTIC ANALYSIS OF MULTIDIMENSIONAL SENSOR DATA FOR SUBSTRATE PROCESSING EQUIPMENT

TECHNICAL FIELD

The instant specification relates to analysis of multidimensional sensor data associated with substrate processing. More specifically, the instant specification relates to holistic temporal analysis of multidimensional sensor data to generate an indication of evolution of substrate processing parameters through a duration of a processing operation.

BACKGROUND

Chambers are used in many types of processing systems. Examples of chambers include etch chambers, deposition chambers, anneal chambers, and the like. Typically, a substrate, such as a semiconductor wafer, is placed on a substrate support within the chamber and conditions in the chamber are set and maintained to process the substrate. Detailed understanding of processing conditions, the effect of conditions on a substrate, and evolutions of these parameters over time enables tight control of product properties.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one aspect of the disclosure, a method includes receiving, by a processing device, first data. The first data includes data from one or more sensors of a processing chamber and is associated with a processing operation. The first data is resolved in at least two dimensions, one of which is time. The method further includes providing the first data to a model. The method further includes receiving from the model second data. The second data includes an indication of an evolution of a processing parameter during the processing operation. The method further includes causing performance of a corrective action in view of the second data.

In another aspect of the disclosure, a system includes memory and a processing device, coupled to the memory. The processing device is configured to receive first data. The first data includes data from one or more sensors of a processing chamber and is associated with a processing operation. The first data is resolved in at least two dimensions, one of which is time. The processing device is further configured to provide the first data to a model. The processing device is further configured to receive from the model second data. The second data includes an indication of an evolution of a processing parameter during the processing operation. The method further includes causing performance of a corrective action in view of the second data.

In another aspect of the disclosure, a non-transitory machine-readable storage medium stores instructions which, when executed, cause a processing device to perform operations. The operations include receiving first data. The first data includes data from one or more sensors of a processing chamber and is associated with a processing operation. The first data is resolved in at least two dimensions, one of which is time. The operations further include providing the first data to a model. The operations further include receiving from the model second data. The second data includes an indication of an evolution of a processing parameter during the processing operation. The operations further include causing performance of a corrective action in view of the second data.

BRIEF DESCRIPTION OF THE DRAWINGS

The present disclosure is illustrated by way of example, and not by way of limitation in the figures of the accompanying drawings.

FIG. 1 is a block diagram illustrating an exemplary system (exemplary system architecture), according to some embodiments.

FIG. 2 is a block diagram of an example data set generator used to create data sets for a model, according to some embodiments.

FIG. 3 is a block diagram illustrating a system for generating output data, according to some embodiments FIGS. 4A-C are flow diagrams of methods associated with analysis of multidimensional sensor data, according to some embodiments.

FIG. 5 depicts a data analysis system for utilizing multidimensional sensor data to generate predictive data, according to some embodiments.

FIG. 6 is a block diagram illustrating a computer system, according to some embodiments.

DETAILED DESCRIPTION

Described herein are technologies directed to processing of multi-dimensional time-dependent sensor data associated with one or more processing operations performed in a processing chamber. Multi-dimensional time-dependent sensor data (e.g., data points include at least time information, information indicative of a second independent variable, and a value) may be addressed holistically to enable understanding of the evolution of process parameters during the processing operations.

Manufacturing equipment (e.g., a processing chamber) is used to produce substrates, such as semiconductor wafers. The properties of these substrates are determined by the conditions in which the substrates were processed. As substrate processing progresses, conditions in the chamber and/or the response of the substrate to those conditions may evolve. For example, a processing operation may include a substrate etching operation, e.g., an operation that removes material from the substrate. Processing parameters such as etch rate may change over the duration of the processing operation. Accurate understanding of temporal process parameter evolution may be used to predict properties of finished products, improve process learning, improve process recipe generation and refining, improve consistency of substrates produced, optimize substrate production, etc.

In some cases, a substrate is placed within a chamber for processing. The processing chamber may include various sensors to report on conditions associated with processing the substrate, e.g., pressure and temperature sensors may report on chamber conditions, sensors may detect spontaneous plasma emission and report on conditions of the plasma, reflectance or scatter of waves from the substrate may report on evolving substrate geometry, etc. Any of these or other sensors associated with a processing chamber may take multiple measurements in time over the duration of a processing operation.

In some conventional systems, data from one or more sensors collected at the same time (or near the same time, e.g., analyzed as though the data was collected simultaneously) may be treated together to generate an indication of conditions at that time. For example, data from multiple pressure sensors may be analyzed to determine a snapshot of pressure conditions in a chamber, optical reflectance data of a substrate may be processed to determine a snapshot of substrate surface geometry, etc.

In some systems, data may be processed in a time-independent manner, e.g., conclusions may be drawn from the data without including data separated in time in analysis, data may be analyzed on a frame-by-frame basis, etc. In some embodiments, further conclusions may be drawn by concatenating an arrangement of these analysis in order, e.g., by fitting some analysis result drawn from several instances of time-independent data with respect to time to draw a temporal conclusion. In some embodiments, time-independent analysis and/or concatenated time-independent analysis may suffer from high noise levels, e.g., due to limited collection time during an ongoing processing operation. Time-independent and/or concatenated time-independent analysis may be difficult to utilize if several pieces of information are targeted for analysis, e.g., a single frame of data may include a limited number of data points, and the breadth conclusions drawn from one frame of data may be restricted by the volume of available information in the data frame.

In one or more embodiments, methods and devices of the current disclosure may address at least one or more of these deficiencies of the conventional approach. This disclosure enables a method of treating multidimensional sensor data in a holistic fashion. Multidimensional sensor data may be received from a processing chamber. Multidimensional data in this context indicates data resolved in more than one independent variable, wherein one of the independent variables is time. For example, spectral data associated with a processing operation may be resolved in wavelength and time, acoustic data may be resolved in frequency and time, pressure and temperature data may be resolved in sensor number and time, etc. In some embodiments, data points resolved in at least two dimensions are provided to a model. The model may include a physics-based model, a machine learning model, etc. The model may be configured to treat the multi-dimensional data simultaneously, e.g., fit the temporal evolution of data along an orthogonal axis simultaneously.

Aspects of this disclosure result in technological advantages over conventional solutions. In a time-independent analysis, sparsity of data constrains the amount of information that may be inferred through fitting, e.g., constrained to fewer floating parameters than available data points in a single time-independent analysis frame. Temporal analysis (e.g., analysis of multidimensional data including time dependence holistically) may alleviate these restrictions: depending on the sampling rate of sensors, length of the processing operation, etc., the number of data points available in a temporal analysis of multidimensional sensor data may be many times larger than in a single frame, e.g., ten times larger, one hundred times larger, etc. More parameters may be understood through such an analysis (e.g., more information may be available for analysis by virtue of including data points associated with separate times in a fitting procedure, and thus more information may be recovered by fitting the data than is available by analysis of a single temporal frame).

In some systems, multidimensional data may include data collected at asynchronous sampling rates and/or asynchronous sampling time points. For example, spectral data may be separated into a number of wavelength measurements (e.g., two dimensions of the multi-dimensional sensor data may be time and wavelength). In some systems, data associated with different wavelengths may be collected at different times, e.g., a spectrometer may collect data associated with a first wavelength at a first time, a second wavelength at a second time, etc. In some embodiments, the spectral data may repeat spectral measurements, e.g., spectral data associated with each wavelength may be collected multiple times, for example by cycling through the target wavelengths multiple times. A conventional frame-by-frame (e.g., time-independent) analysis may approximate each cycle of data to be associated with a single time point. A holistic time-dependent analysis may mitigate inaccuracies associated with such approximations by treating data points in a multi-dimensional manner (e.g., associating each spectral measurement with a unique time point, in some embodiments).

In some embodiments, time-independent analysis may be subject to high levels of noise. The number of data points included in a single time-independent analysis operation (e.g., a single data frame) may be small. Noise may be difficult to compensate for within a small number of available data points, e.g., outlier detection may be difficult, smoothing of data may be difficult, etc. Temporal analysis of multidimensional sensor data may alleviate this noise sensitivity, by analyzing a larger number of data points together, noise in individual data points may be more easily handled and/or data points more easily rejected by the analysis model.

Temporal holistic analysis of multidimensional sensor data may provide a detailed picture of temporal evolution of in-chamber parameters otherwise difficult to determine. For example, time-independent analyses may report on etch depth at each time step, and etch rate inferred by tracking the temporal evolution of the etch depth over the duration of a processing operation. Temporal analysis may report directly on both etch rate and etch depth, e.g., by utilizing a physics-based model that characterizes temporal evolution of optical reflectance data from a substrate as etch depth increases. Increased precision, accuracy, and efficiency of process learning (e.g., understanding newly designed processing recipes, updating processing recipes for new applications, etc.), calibration of behavior-based process modeling, additional information relevant for process control, greater condition, parameter, and product consistency, improved chamber matching, improved performance evaluation, improved performance regulation (e.g., return of a tool to production after a maintenance event) etc., may all be enabled by temporal analysis of multidimensional sensor data.

In one aspect of the disclosure, a method includes receiving, by a processing device, first data. The first data includes data from one or more sensors of a processing chamber and is associated with a processing operation. The first data is resolved in at least two dimensions, one of which is time. The method further includes providing the first data to a model. The method further includes receiving from the model second data. The second data includes an indication of an evolution of a processing parameter during the processing operation. The method further includes causing performance of a corrective action in view of the second data.

In another aspect of the disclosure, a system includes memory and a processing device, coupled to the memory. The processing device is configured to receive first data. The first data includes data from one or more sensors of a processing chamber and is associated with a processing operation. The first data is resolved in at least two dimensions, one of which is time. The processing device is further configured to provide the first data to a model. The processing device is further configured to receive from the model second data. The second data includes an indication of an evolution of a processing parameter during the processing operation. The method further includes causing performance of a corrective action in view of the second data.

In another aspect of the disclosure, a non-transitory machine-readable storage medium stores instructions which, when executed, cause a processing device to perform operations. The operations include receiving first data. The first data includes data from one or more sensors of a processing chamber and is associated with a processing operation. The first data is resolved in at least two dimensions, one of which is time. The operations further include providing the first data to a model. The operations further include receiving from the model second data. The second data includes an indication of an evolution of a processing parameter during the processing operation. The operations further include causing performance of a corrective action in view of the second data.

FIG. 1 is a block diagram illustrating an exemplary system 100 (exemplary system architecture), according to some embodiments. The system 100 includes a client device 120, manufacturing equipment 124, sensors 126, metrology equipment 128, a predictive server 112, and data store 140. Predictive server 112 may be part of predictive system 110. Predictive system 110 may further include server machines 170 and 180.

In some embodiments, manufacturing equipment 124 (e.g., cluster tool) is part of a substrate processing system (e.g., integrated processing system). Manufacturing equipment 124 includes one or more of a controller, an enclosure system (e.g., substrate carrier, front opening unified pod (FOUP), autoteach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafers, etc.) between the load lock, the processing chambers, and the transfer chamber. In some embodiments, manufacturing equipment 124 includes components of substrate processing systems. In some embodiments, manufacturing equipment 124 is used to produce one or more products (e.g., substrates, semiconductors, wafers, etc.). In some embodiments, manufacturing equipment 124 is used to produce one or more components to be used in substrate processing systems.

Sensors 126 may provide sensor data 142 associated with manufacturing equipment 124 (e.g., associated with producing, by manufacturing equipment 124, corresponding products, such as wafers). Sensor data 142 may be used for equipment health and/or product health (e.g., product quality), for example. Manufacturing equipment 124 may produce products following a recipe or performing processing operations and/or processing runs over a period of time. In some embodiments, sensor data 142 may include values of one or more of temperature (e.g., heater temperature), spacing (SP), pressure, High Frequency Radio Frequency (HFRF), voltage of Electrostatic Chuck (ESC), electrical current, flow (e.g., of one or more gases), power, voltage, optical data (e.g., substrate reflectance spectra), acoustic data (e.g., substrate acoustic scattering data), etc. Sensor data may include in-situ measurements of a substrate in a processing chamber, e.g., a substrate undergoing processing operations. Sensor data 142 may include historical sensor data 144 and current sensor data 146. Current data, as used herein, indicates data associated with a processing run in progress or a processing run currently under analytic investigation, e.g., by providing sensor data, metrology data, manufacturing parameters, etc., to a machine learning or physics-based model. Manufacturing equipment 124 may be configured according to manufacturing parameters 150. Manufacturing parameters 150 may be associated with or indicative of parameters such as hardware parameters (e.g., settings or components (e.g., size, type, etc.) of the manufacturing equipment 124) and/or process parameters of the manufacturing equipment. Manufacturing parameters 150 may include historical manufacturing data and/or current manufacturing data. Manufacturing parameters 150 may be indicative of input settings to the manufacturing device (e.g., heater power, gas flow, etc.). Sensor data 142 and/or manufacturing parameters 150 may be generated while the manufacturing equipment 124 is performing manufacturing processes (e.g., equipment readings when processing products). Sensor data 142 may be different for each product (e.g., each wafer).

In some embodiments, sensor data 142, metrology data 160, and/or manufacturing parameters 150 may be processed (e.g., by the client device 120 and/or by the predictive server 112). Processing of sensor data 142 may include generating features. In some embodiments, the features are a pattern in the sensor data 142, metrology data 160, and/or manufacturing parameters 150 (e.g., slope, width, height, peak, etc.) or a combination of values from the sensor data 142, metrology data 160, and/or manufacturing parameters 150 (e.g., power derived from voltage and current, etc.). Sensor data 142 may include features and the features may be used by predictive component 114 for performing signal processing and/or for obtaining predictive data 168, possibly for performance of a corrective action. Predictive data 168 may be any data associated with predictive system 110, e.g. predicted performance data of a substrate, of a substrate processing operation, of a component of manufacturing equipment 124, etc. In some embodiments, predictive data 168 may be indicative of substrate metrology. In some embodiments, predictive data 168 may be indicative of process conditions. In some embodiments, predictive data 168 may be indicative of temporal evolution of conditions, substrate metrology, processing rate, etc., during the duration of a process operation.

Each instance (e.g., set) of sensor data 142 may correspond to a product (e.g., a wafer), a set of manufacturing equipment, a type of substrate produced by manufacturing equipment, a combination thereof, or the like. Each instance of metrology data 160 and manufacturing parameters 150 may likewise correspond to a product, a set of manufacturing equipment, a type of substrate produced by manufacturing equipment, a combination thereof, or the like. Data store 140 may further store information associating sets of different data types, e.g. information indicative that a set of sensor data, a set of metrology data, and/or a set of manufacturing data are all associated with the same product, manufacturing equipment, type of substrate, etc. In some embodiments, predictive system 110 may generate predictive data 168 using machine learning. In some embodiments, predictive system 110 may generate predictive data 168 with the use of one or more physics-based models.

Client device 120, manufacturing equipment 124, sensors 126, metrology equipment 128, predictive server 112, data store 140, server machine 170, and server machine 180 may be coupled to each other via a network 130. In some embodiments, network 130 is a public network that provides client device 120 with access to predictive server 112, data store 140, and/or other publicly available computing devices. In some embodiments, network 130 is a private network that provides client device 120 access to manufacturing equipment 124, sensors 126, metrology equipment 128, data store 140, and/or other privately available computing devices. Network 130 may include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

Client device 120 may include one or more computing devices such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. Client device 120 may include one or more virtual computing devices, e.g., cloud-based computing devices, cloud computing services, etc. Client device 120 may include a corrective action component 122. Corrective action component 122 may receive user input (e.g., via a Graphical User Interface (GUI) displayed via the client device 120) of an indication associated with manufacturing equipment 124. The user interface may present an indication of evolution of a processing parameters, may present an indication of a corrective action to be performed, etc. In some embodiments, corrective action component 122 transmits the indication to the predictive system 110, receives output (e.g., predictive data 168) from predictive system 110, determines a corrective action based on the output, and causes the corrective action to be implemented.

In some embodiments, predictive system 110 may further include a predictive component 114. Predictive component 114 may take data retrieved from model 190 to generate predictive data 168. In some embodiments, predictive component 114 provides predictive data 168 to client device 120, and client device 120 causes a corrective action via corrective action component 122 in view of predictive data 168. In some embodiments, corrective action component 122 may receive current sensor data 146 associated with production of a substrate and provide the data to predictive system 110.

In some embodiments, corrective action component 122 stores data (e.g., data associated with intermediate analysis steps in generating predictive data 168) in data store 140 and predictive server 112 retrieves the data from data store 140. In some embodiments, predictive server 112 may store output (e.g., predictive data 168) of the trained model(s) 190 in data store 140 and client device 120 may retrieve the output from data store 140. In some embodiments, corrective action component 122 receives an indication of a corrective action from predictive system 110 and causes the corrective action to be implemented. Each client device 120 may include an operating system that allows users to one or more of generate, view, or edit data (e.g., indication associated with manufacturing equipment 124, corrective actions associated with manufacturing equipment 124, etc.).

In some embodiments, metrology data 160 corresponds to historical property data of products (e.g., produced using manufacturing parameters associated with historical sensor data and historical manufacturing parameters) and predictive data 168 is associated with predicted property data (e.g., of products to be produced or that have been produced in conditions recorded by current sensor data and/or current manufacturing parameters). In some embodiments, the predictive data 168 is predicted metrology data (e.g., virtual metrology data) of the products to be produced or that have been produced according to conditions recorded as current sensor data and/or current manufacturing parameters. In some embodiments, predictive data 168 is or includes an indication of abnormalities (e.g., abnormal products, abnormal components, abnormal manufacturing equipment, abnormal energy usage, etc.) and/or one or more causes of the abnormalities. In some embodiments, predictive data 168 includes an indication of change over time or drift in some component of manufacturing equipment 124, sensors 126, metrology equipment 128, and the like. In some embodiments, predictive data 168 includes an indication of an end of life of a component of manufacturing equipment 124, sensors 126, metrology equipment 128, or the like. In some embodiments, predictive data 168 includes a comparison of performance of a chamber, tool, recipe, product design, etc., to another.

Performing manufacturing processes that result in defective products can be costly in time, energy, products, components, manufacturing equipment 124, the cost of identifying the defects and discarding the defective product, the cost of discovering and correcting the cause of the defect, etc. By inputting sensor data 142 (e.g., current sensor data 146) into a predictive model (e.g., model 190), receiving output of predictive data 168, and performing a corrective action based on predictive data 168, system 100 can have the technical advantage of avoiding the cost of producing, identifying, and discarding defective products.

Performing manufacturing processes that result in failure of the components of the manufacturing equipment 124 can be costly in downtime, damage to products, damage to equipment, express ordering replacement components, etc. By inputting sensor data 142 (e.g., current sensor data 146) to a predictive model (e.g., model 190), receiving output of predictive data 168, comparing data over time to diagnose drifting or failing components (e.g., also recorded as predictive data 168), and performing corrective actions (e.g., predicted operational maintenance, such as replacement, processing, cleaning, etc. of components, updating recipe parameters, etc.) based on the predictive data 168, system 100 can have the technical advantage of avoiding the cost of one or more of unexpected component failure, unscheduled downtime, productivity loss, unexpected equipment failure, product scrap, or the like. Monitoring the performance over time of components, e.g. manufacturing equipment 124, sensors 126, metrology equipment 128, and the like, may provide indications of degrading components. Monitoring the performance of a component over time may extend the component's operational lifetime, for instance if, after a standard replacement interval passes, measurements indicative that the component may still perform well (e.g., performance above a threshold) for a time (e.g., until the next planned maintenance event).

Manufacturing parameters may be suboptimal for producing products which may have costly results of increased resource (e.g., energy, coolant, gases, etc.) consumption, increased amount of time to produce the products, increased component failure, increased amounts of defective products, etc. By inputting the sensor data 142 into a trained predictive model (e.g., model 190), receiving an output of predictive data 168, and performing (e.g., based on predictive data 168) a corrective action of updating manufacturing parameters (e.g., setting optimal manufacturing parameters), system 100 can have the technical advantage of using optimal manufacturing parameters (e.g., hardware parameters, process parameters, optimal design) to avoid costly results of suboptimal manufacturing parameters.

Corrective action may be associated with one or more of Computational Process Control (CPC), Statistical Process Control (SPC) (e.g., SPC on electronic components to determine process in control, SPC to predict useful lifespan of components, SPC to compare to a graph of 3-sigma, etc.), Advanced Process Control (APC), model-based process control, preventative operative maintenance, design optimization, updating of manufacturing parameters, updating manufacturing recipes, feedback control, machine learning modification, or the like.

In some embodiments, the corrective action includes providing an alert (e.g., an alarm to stop or not perform the manufacturing process if predictive data 168 indicates a predicted abnormality, such as an abnormality of the product, a component, or manufacturing equipment 124) to a user. In some embodiments, performance of the corrective action includes causing updates to one or more manufacturing parameters. In some embodiments, performance of the corrective action includes causing updates to one or more calibration tables and/or equipment constants (e.g., a set point provided to a component may be adjusted by a value across a number of process recipes, for example voltage applied to a heater may be increased by 3% for all processes using the heater). In some embodiments, performance of the correction action includes updating a process recipe (e.g., to adjust an extent or rate of a processing parameter, such as etch rate, including horizontal etch rate, vertical etch rate, etc.; etch depth; deposition rate; deposition depth, etc.).

Manufacturing parameters may include hardware parameters (e.g., replacing components, using certain components, replacing a processing chip, updating firmware, etc.) and/or process parameters (e.g., temperature, pressure, flow, rate, electrical current, voltage, gas flow, lift speed, etc.). In some embodiments, the corrective action includes causing preventative operative maintenance (e.g., replace, process, clean, etc. components of the manufacturing equipment 124). In some embodiments, the corrective action includes causing design optimization (e.g., updating manufacturing parameters, manufacturing processes, manufacturing equipment 124, etc. for an optimized product). In some embodiments, the corrective action includes a updating a recipe (e.g., updating timing of manufacturing equipment 124 to be in an idle mode, a sleep mode, a warm-up mode, etc., updating set points such as temperature or pressure during a processing operation, etc.).

Predictive server 112, server machine 170, and server machine 180 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc. Predictive server 112, server machine 170, and server machine 180 may include one or more virtual computing devices, e.g., cloud computing devices, cloud computing services, remote computing resources, etc.

Predictive server 112 may include predictive component 114. Predictive component 114 may be used to generate predictive data 168. In some embodiments, predictive component 114 may receive sensor data 142, and/or manufacturing parameters 150 (e.g., receive from the client device 120, retrieve from the data store 140) and generate output, e.g., predictive output, output for performing corrective actions associated with manufacturing equipment 124, etc., based on the provided data. In some embodiments, predictive component 114 may use one or more models 190 to determine the output for performing the corrective action based on current data. Model 190 may be a single model, an ensemble model, or a collection of models used to process data. Model 190 may include one or more physics-based models, digital twin models, supervised machine learning models, unsupervised machine learning models, semi-supervised machine learning models, statistical models, etc.

In some embodiments, data indicative of properties of a substrate (e.g., current sensor data 146) is provided to a modeling system including one or more physics-based models. The modeling system may be configured to generate an indication of the temporal evolution of one or more processes (e.g., processing parameters), e.g., process time dependence, such as etch depth evolution, etch rate evolution, deposition rate evolution, etc. Current sensor data 146 provided to the modeling system (e.g., model 190 of predictive system 110) may be multidimensional, e.g., resolved in at least two independent variables, two independent axes, etc. The multidimensional data may be resolved in time and at least one other dimension. For example, the multidimensional data may include optical reflectance data of a substrate in processing. The data may include data from several wavelengths (e.g., a first dimension of resolution may be wavelength) taken multiple times throughout a duration (e.g., a second dimensions of resolution of the data may be time). Possible dimensions of resolution may include wavelength (e.g., of electromagnetic radiation, including optical, IR, UV, X-Ray, etc., analysis), frequency (e.g., of acoustic signals), location (e.g., location of a sensor, location of spatially resolved data of a substrate, etc.), sensor ID, etc.

The modeling system (e.g., model 190) may perform analysis operations (e.g., fitting to a physical model, generating output via a machine learning model, etc.) upon the multidimensional data. In some embodiments, multidimensional sensor data (e.g., current sensor data 146) may be provided to the modeling system after conclusion of a processing operation, e.g., sensor data indicative of the entire duration of an operation may be analyzed. In some embodiments, multidimensional sensor data associated with a portion of the duration of a processing operation may be analyzed. Multidimensional sensor data may be analyzed holistically, e.g., data along multiple axes may be fit simultaneously, in contrast to some systems that treat sensor data as a series of frame-by-frame (e.g., time independent) analysis, stitched together (e.g., plotted on a time axis) to generate an indication of time evolution of a process. In some embodiments, a fit to a multi-dimensional physical model may be performed, e.g., a physical understanding of the evolution of multiple measureable parameters over time may be utilized to generate the physics-based model, generate a fit, generate parameters for modeling process variable evolution, etc.

Holistic treatment of multidimensional sensor data (e.g., fitting data resolved in multiple dimensions together) provides distinct advantages to other methods. In some embodiments, sensor data may be sparse, e.g., spectral data may be resolved into a fairly small number of wavelength measurements (for example, to reduce measurement time so as to not delay processing operations). Fitting sparse data limits the amount of information extractable from the analysis, e.g., due to overfitting. Sparse data is also more sensitive to noise than data sets including a larger number of data points. Holistic treatment of multidimensional sensor data alleviates at least these challenges by utilizing data points collected at multiple times in a fitting/analysis scheme. More data points included in the fit increases the volume of extractable information (e.g., the number of dimensions of a product that may be predicted, the accuracy to which the temporal evolution of a process or processing parameter may be predicted, etc.), increases reliability of information extraction, increases resistance of analysis to noisy signals, etc.

In some embodiments, the modeling system (e.g., model 190) may include a physics-based model. The physics-based model may provide a correlation between sensor data and a physical system (e.g., substrate). The physics-based model may be a time-dependent model, e.g., may describe the evolution of properties of the physical system (e.g., substrate) over time. For example, the physics-based model may describe the evolution of spectral reflectance data as etch depth increases over the duration of a processing operation. In some embodiments, the physics-based model may accept time-resolved data associated with spectrally-resolved detection of electromagnetic radiation. The physics-based model may represent a process behavior parameter (e.g., etch depth, etch rate, deposition rate, etc.) by a function (e.g., a linear function, a piece-wise function, a polynomial function, combinations of functions, etc.). The process behavior parameter may be expressed as a function of time and a number of fit parameters (e.g., polynomial coefficients) that are derived by the physics-based model based on the multi-dimensional input sensor data. In some embodiments, the modeling system may include a trained machine learning model. The machine learning model may be configured to accept as input sensor data and generate as output an indication of evolution of processing parameters. In some embodiments, a machine learning model may be configured to perform a subset of operations involved in the modeling system. Further description of a modeling system for analysis of multidimensional sensor data is found in connection with FIG. 5.

In some embodiments, data indicative of properties of a substrate produced (e.g., current sensor data 146) is provided to a trained machine learning model (e.g., model 190). The machine learning model is trained to output data indicative of a corrective action to produce a substrate with different characteristics. In some embodiments, data indicative of evolution of a processing parameter (e.g., etch depth, etch rate, etc.) is output by the machine learning model. In some embodiments, data indicative of a corrective action to adjust evolution of a processing parameter is output by the machine learning model (e.g., a recipe adjustment).

Historical sensor data may be used in combination with current sensor data to detect drift, changes, aging, etc. of components of manufacturing equipment 124. Sensor data 142 monitored over time may generate information indicative of changes to a processing system, e.g., component drift or failure, sensor drift or failure, maintenance to be performed, recovery of a chamber after maintenance is performed, etc. Predictive component 114 may use combinations and comparisons of sensor data 142, manufacture parameters 150, metrology data 160, etc. to generate predictive data 168. In some embodiments, predictive data 168 includes data predicting the lifetime of components of manufacturing equipment 124, sensors 126, etc.

In some embodiments, sensor data from a number of chambers may be used to detect chamber operational differences, perform chamber matching procedures, etc. Sensor data 142 generated by multiple chambers may be provided to modeling system, e.g., model 190. Model 190 may generate an indication of temporal processing parameter evolution over the duration of a processing operation in multiple processing chambers. Differences is processing parameter evolution between chambers may indicate chamber matching procedures to be performed, e.g., recipe update, maintenance, component replacement, etc.

In some embodiments, predictive component 114 receives data, such as sensor data 142, metrology data 160, manufacturing parameters 150, etc., and may perform pre-processing such as extracting patterns in the data or combining data to new composite data. Predictive component 114 may then provide the data to model 190 as input. Model 190 may include one or more physics-based models, digital twin models, machine learning models, etc., and may accept as input sensor data. Model 190 may include a trained machine learning model, a statistical model, etc., configured to further process data associated with properties of a substrate support. Predictive component 114 may receive from model 190 predictive data, indicative of chamber performance, predicted substrate properties, a manufacturing fault, component drift, or the like. Predictive component 114 may then cause a corrective action to occur. The corrective action may include sending an alert to client device 120. The corrective action may also include updating manufacturing parameters of manufacturing equipment 124. The corrective action may also include generating predictive data 168, indicative of chamber or instrument drift, aging, or failure, recipe success or failure, predicted product properties, etc.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). Data store 140 may include remote storage, cloud data storage, cloud-based storage services, etc. Data store 140 may store sensor data 142, manufacturing parameters 150, metrology data 160, and predictive data 168. Sensor data 142 may include sensor data time traces over the duration of manufacturing processes, associations of data with physical sensors, pre-processed data, such as averages and composite data, and data indicative of sensor performance over time (i.e., many manufacturing processes). Sensor data 142 may include multidimensional data, e.g., data resolved in both time and at least one other dimension. Manufacturing parameters 150 and metrology data 160 may contain similar features, e.g., pre-processed data, associations between data and products/operations, etc. Sensor data 142, manufacturing parameter data 150, and metrology data 160 may contain historical data (e.g., at least a portion for training various models represented in FIG. 1 by model 190). Metrology data 160 may be metrology data of produced substrates, as well as sensor data, manufacturing data, and model data corresponding to those products. Metrology data 160 may be leveraged to design processes for making further substrates. Predictive data 168 may include predictions of metrology data resulting from operation of a substrate support, predictions of component drift, aging, or failure, predictions of component lifetimes, predictions of processing parameter evolution over the duration of a processing operation, etc. Predictive data 168 may also include data indicative of components of system 100 aging and failing over time.

In some embodiments, predictive system 110 further includes server machine 170 and server machine 180. Server machine 170 includes a data set generator 172 that is capable of generating data sets (e.g., a set of data inputs and a set of target outputs) to train, validate, and/or test model 190. Some operations of data set generator 172 are described in detail below with respect to FIGS. 2 and 4A. In some embodiments, data set generator 172 may partition historical data (e.g., historical sensor data, historical metrology data, etc.) into a training set (e.g., sixty percent of the data), a validating set (e.g., twenty percent of the data), and a testing set (e.g., twenty percent of the data). In some embodiments, predictive system 110 (e.g., via predictive component 114) generates multiple sets of features. For example a first set of features may correspond to a first set of types of sensor data (e.g., from a first set of sensors, first combination of values from first set of sensors, first patterns in the values from the first set of sensors) that correspond to each of the data sets (e.g., training set, validation set, and testing set) and a second set of features may correspond to a second set of types of sensor data (e.g., from a second set of sensors different from the first set of sensors, second combination of values different from the first combination, second patterns different from the first patterns) that correspond to each of the data sets. In some embodiments, training, validating, and/or testing sets may be utilizing in preparing a machine learning model for operation. In some embodiments, training, validating, and/or training sets may be utilizing in preparing a physics-based model for operation, e.g., to account for incorrect assumptions in model building, to account for unknown parameters (e.g., differences in manufacturing equipment components within manufacturing tolerances), etc.

Server machine 180 includes a training engine 182, a validation engine 184, selection engine 185, and/or a testing engine 186. An engine (e.g., training engine 182, a validation engine 184, selection engine 185, and a testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 may be capable of training a model 190 using one or more sets of features associated with the training set from data set generator 172. The training engine 182 may generate multiple trained models 190, where each trained model 190 corresponds to a distinct set of features of the training set (e.g., sensor data from a distinct set of sensors). For example, a first trained machine learning model may have been trained using all features (e.g., X1-X5), a second trained machine learning model may have been trained using a first subset of the features (e.g., X1, X2, X4), and a third trained machine learning model may have been trained using a second subset of the features (e.g., X1, X3, X4, and X5) that may partially overlap the first subset of features. Data set generator 172 may receive the output of a trained model (e.g., 190), collect that data into training, validation, and testing data sets, and use the data sets to train a second model. Some or all of the operations of server machine 180 may be used to train various types of models, including physics-based models, supervised machine learning models, unsupervised machine learning models, etc.

Validation engine 184 may be capable of validating a trained model 190 using a corresponding set of features of the validation set from data set generator 172. For example, a first trained model 190 that was trained using a first set of features of the training set may be validated using the first set of features of the validation set. The validation engine 184 may determine an accuracy of each of the trained models 190 based on the corresponding sets of features of the validation set. The validation engine 184 may discard trained models 190 that have an accuracy that does not meet a threshold accuracy. In some embodiments, the selection engine 185 may be capable of selecting one or more trained models 190 that have an accuracy that meets a threshold accuracy. In some embodiments, the selection engine 185 may be capable of selecting the trained model 190 that has the highest accuracy of the trained models 190.

Testing engine 186 may be capable of testing a trained model 190 using a corresponding set of features of a testing set from data set generator 172. For example, a first trained model 190 that was trained using a first set of features of the training set may be tested using the first set of features of the testing set. The testing engine 186 may determine a trained model 190 that has the highest accuracy of all of the trained models based on the testing sets.

Model 190 may refer to a physics-based model describing temporal evolution of sensor data over a duration associated with a processing operation. The physics-based model may be configured to solve equations describing the flow energy, reflectance of light, interaction with acoustic stimuli, etc., in and around a substrate. The physics-based model may be refined by training, e.g., measuring properties of a substrate over a processing operation and utilizing results to refine the physics-based model (e.g., by fitting one or more parameters to the experimental data).

Model 190 may refer to a machine learning model, which may be the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that captures these patterns. In some embodiments, machine learning model 190 may predict properties of substrates. In some embodiments, machine learning model 190 may predict failure modes of manufacturing chamber components. In some embodiments, machine learning model 190 may predict evolution of processing parameters over a duration associated with a processing operation.

Predictive component 114 may provide input data to a trained machine learning model 190 and may run the trained machine learning model 190 on the input to obtain one or more outputs. Predictive component 114 may be capable of determining (e.g., extracting) predictive data 168 from the output of the trained machine learning model 190 and may determine (e.g., extract) confidence data from the output that indicates a level of confidence that the predictive data 168 is an accurate predictor of a process associated with the input data for products produced or to be produced, or an accurate predictor of components of manufacturing equipment 124. Predictive component 114 may be capable of determining predictive data 168, including predictions on finished substrate properties and predictions of effective lifetimes of components of manufacturing equipment 124, sensors 126, or metrology equipment 128 based on the output of model 190. Predictive component 114 or corrective action component 122 may use the confidence data to decide whether to cause a corrective action associated with the manufacturing equipment 124 based on predictive data 168.

The confidence data may include or indicate a level of confidence. As an example, predictive data 168 may indicate the properties of a finished wafer given a set of manufacturing inputs, including the use of a substrate support described with substrate support data 154. The confidence data may indicate that the predictive data 168 is an accurate prediction for products associated with at least a portion of the input data. In one example, the level of confidence is a real number between 0 and 1 inclusive, where 0 indicates no confidence that the predictive data 168 is an accurate prediction for products processed according to input data and 1 indicates absolute confidence that the predictive data 168 accurately predicts properties of products processed according to input data. Responsive to the confidence data indicating a level of confidence below a threshold level for a predetermined number of instances (e.g., percentage of instances, frequency of instances, total number of instances, etc.) the predictive component 116 may cause the trained machine learning model 190 to be re-trained (e.g., based on current sensor data 146, current manufacturing parameters 150, etc.).

For purpose of illustration, rather than limitation, aspects of the disclosure describe the training of one or more models 190 using historical data and inputting current data into the one or more trained models 190 to determine predictive data 168. In other implementations, a heuristic model or rule-based model is used to determine predictive data (e.g., without using a trained machine learning model). Predictive component 114 may monitor historical data and metrology data 160. Any of the information described with respect to data inputs 210 of FIG. 2 may be monitored or otherwise used in the heuristic or rule-based model.

In some embodiments, the functions of client device 120, predictive server 112, server machine 170, and server machine 180 may be provided by a fewer number of machines. For example, in some embodiments server machines 170 and 180 may be integrated into a single machine, while in some other embodiments, server machine 170, server machine 180, and predictive server 112 may be integrated into a single machine. In some embodiments, client device 120 and predictive server 112 may be integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, predictive server 112 may determine the corrective action based on the predictive data 168. In another example, client device 120 may determine the predictive data 168 based on output from the trained machine learning model or the physics-based model.

In addition, the functions of a particular component can be performed by different or multiple components operating together. One or more of predictive server 112, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Embodiments of the disclosure may be applied to data quality evaluation, feature enhancement, model evaluation, Virtual Metrology (VM), Predictive Maintenance (PdM), limit optimization, or the like.

Although embodiments of the disclosure are discussed in terms of generating predictive data 168 to perform a corrective action in manufacturing facilities (e.g., semiconductor manufacturing facilities), embodiments may also be generally applied to improved data processing by utilizing multidimensional sensor data to perform a holistic data fit, and use the fitted data to improve processing conditions, parameters, set points, processes, etc.

Figure 2:
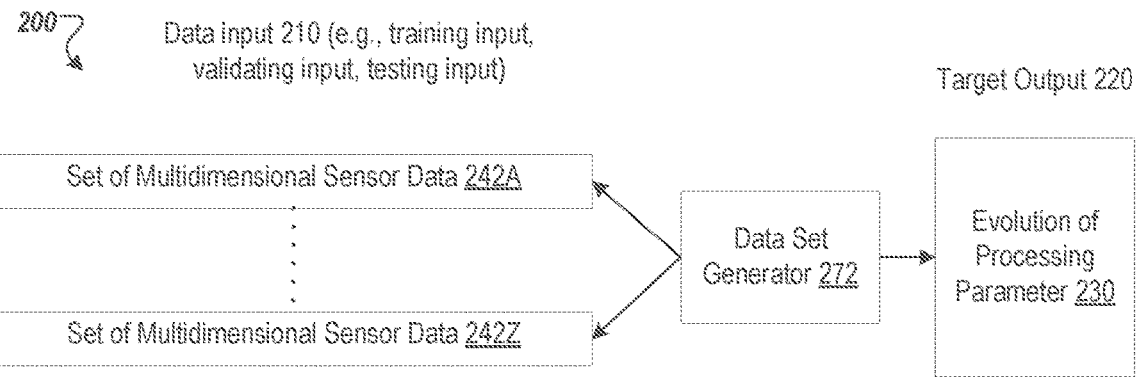

FIG. 2 is a block diagram of an example data set generator 272 (e.g., data set generator 172 of FIG. 1), used to create data sets for a model (e.g., model 190 of FIG. 1), according to some embodiments. A data set generator 272 may be part of server machine 170 of FIG. 1. In some embodiments, system 100 of FIG. 1 includes multiple models. In such cases, each model may have a separate data set generator, or models may share a data set generator. Depicted in FIG. 2 is a data set generator associated with a machine learning model configured to take as input multidimensional sensor data associated with processing of a substrate (e.g., in-situ optical substrate reflectance data). The machine learning model is configured to provide as output information indicative of evolution of one or more processing parameters over a duration associated with performing a processing operation. Similar data set generators may be utilized for machine learning models performing other functions, substituting types of input and output data to align with target functionality. In some embodiments, a machine learning model included in model 190 may be an unsupervised or a semi-supervised model, e.g., is to be trained using at least a portion of unlabeled training data. A data set generator similar to data set generator 272 may be used to generate data sets for training an unsupervised or semi-supervised model, e.g., by generating sets of training input data without generating associated target output data. In some embodiments, a physics-based model is to be trained (e.g., physics-based model is to be adjusted or refined based on measured data). A data set generator similar to data set generator 272 may be utilized to generate data sets for a physics-based model.

Referring to FIG. 2, system 200 containing data set generator 272 (e.g., data set generator 172 of FIG. 1) creates data sets for a machine learning model (e.g., model 190 of FIG. 1). Data set generator 272 may create data sets using data retrieved as output from sensors associated with a processing chamber, metrology measurements associated with a substrate, etc. In some embodiments, data set generator 272 creates training input, validating input, testing input, etc. from multidimensional sensor data associated with one or more processing operations. Data set generator 272 also generates target output 220 for training a machine learning model. Target output includes data indicative of a temporal evolution of one or more processing parameters through a duration associated with the processing operation, e.g., etch depth, etch rate, deposition rate, structure dimensions, etc. In some embodiments, a machine learning model may be utilized to perform a different task, with corresponding changes to input and target output data. Data input 210 and target output 220 are supplied to a machine learning model for training, testing, validating, etc.

It is within the scope of this disclosure for training input 210 and target output 220 to be represented in a variety of different ways. A vector or matrix of values, lists, images, and other data types may all be used as data input 210 and target output 220.

In some embodiments, data set generator 272 generates a data set (e.g., training set, validating set, testing set) that includes one or more data inputs 210 (e.g., training input, validating input, testing input) and may include one or more target outputs 220 that correspond to the data inputs 210. The data set may also include mapping data that maps the data inputs 210 to the target outputs 220. Data inputs 210 may also be referred to as "features," "attributes," or "information." In some embodiments, data set generator 272 may provide the data set to the training engine 182, validating engine 184, or testing engine 186 of FIG. 1, where the data set is used to train, validate, or test machine learning model 190 of FIG. 1. Some embodiments of generating a training set may further be described with respect to FIG. 4A.

In some embodiments, data set generator 272 may generate a first data input corresponding to a first set of multidimensional sensor data 242A to train, validate, or test a first machine learning model. Data set generator 272 may generate a second data input corresponding to a second set of multidimensional sensor data 242B to train, validate, or test a second machine learning model.

In some embodiments, data set generator 272 may perform operations on one or more of data input 210 and target output 220. Data set generator 272 may extract patterns from the data (slope, curvature, etc.), may combine data (average, feature production, etc.), or may separate data into groups (e.g., train a model on a subset of the multidimensional sensor data) and use the groups to train separate models.

Data inputs 210 and target outputs 220 to train, validate, or test a machine learning model may include information for a particular processing chamber. Data inputs 210 and target outputs 220 may include information for a particular product design (e.g., used for all substrates of that design). Data inputs 210 and target outputs 220 may include information for a particular type of processing, target substrate property, target processing chamber fleet, or may be grouped together in another way.

In some embodiments, data set generator 272 may generate a set of target output 220, including evolution of processing parameter 230. Target output 220 may be separated into sets corresponding to sets of input data. Different sets of target output 220 may be used in connection with the similarly defined sets of data input 210, including training different models, using different sets for training, validating, and testing, etc.

Target output 220 may be generated by measuring evolution of one or more target processing parameters (e.g., using a method other than machine learning). In some embodiments, a machine learning model may be configured to output one or more corrective actions, e.g., recommended recipe updates. Corrective action output 220 may be generated by correlating trends in performance data to appropriate corrective actions (e.g., by using a method other than machine learning). A user may indicate that performing a particular corrective action addressed a difference between historical predicted performance and measured performance, a manufacturing fault may be intentionally introduced to generate data useful for training, etc. In some embodiments, a model may be trained without target output 220 (e.g., an unsupervised or semi-supervised model). A model trained that is not provided with target output may, for example, be trained to recognize significant (e.g., outside an error threshold) differences between predicted and measured performance data.

In some embodiments, the information used to train the machine learning model may be from specific types of manufacturing equipment (e.g., manufacturing equipment 124 of FIG. 1) of the manufacturing facility having specific characteristics and allow the trained machine learning model to determine outcomes for a specific group of manufacturing equipment 124 based on input of multidimensional sensor data associated with one or more components sharing characteristics of the specific group. In some embodiments, the information used to train the machine learning model may be for components from two or more manufacturing facilities and may allow the trained machine learning model to determine outcomes for components based on input from one manufacturing facility.

In some embodiments, subsequent to generating a data set and training, validating, or testing a machine learning model using the data set, the machine learning model may be further trained, validated, or tested, or adjusted, e.g., via retraining procedures.

In some embodiments, a data set generator similar to data set generator 272 may be utilized for training (e.g., updating, refining, etc.) a physics-based model. A physics-based model may be trained, for example, to correct for inaccurate assumptions (e.g., approximations in equations, material properties, etc.), correct for unknown information (e.g., differences within manufacturing tolerance in manufactured components), etc. Training a physics-based model may include adjusting parameters of the model to decrease residuals between model output and target output, e.g., by gradient descent.

Figure 3:
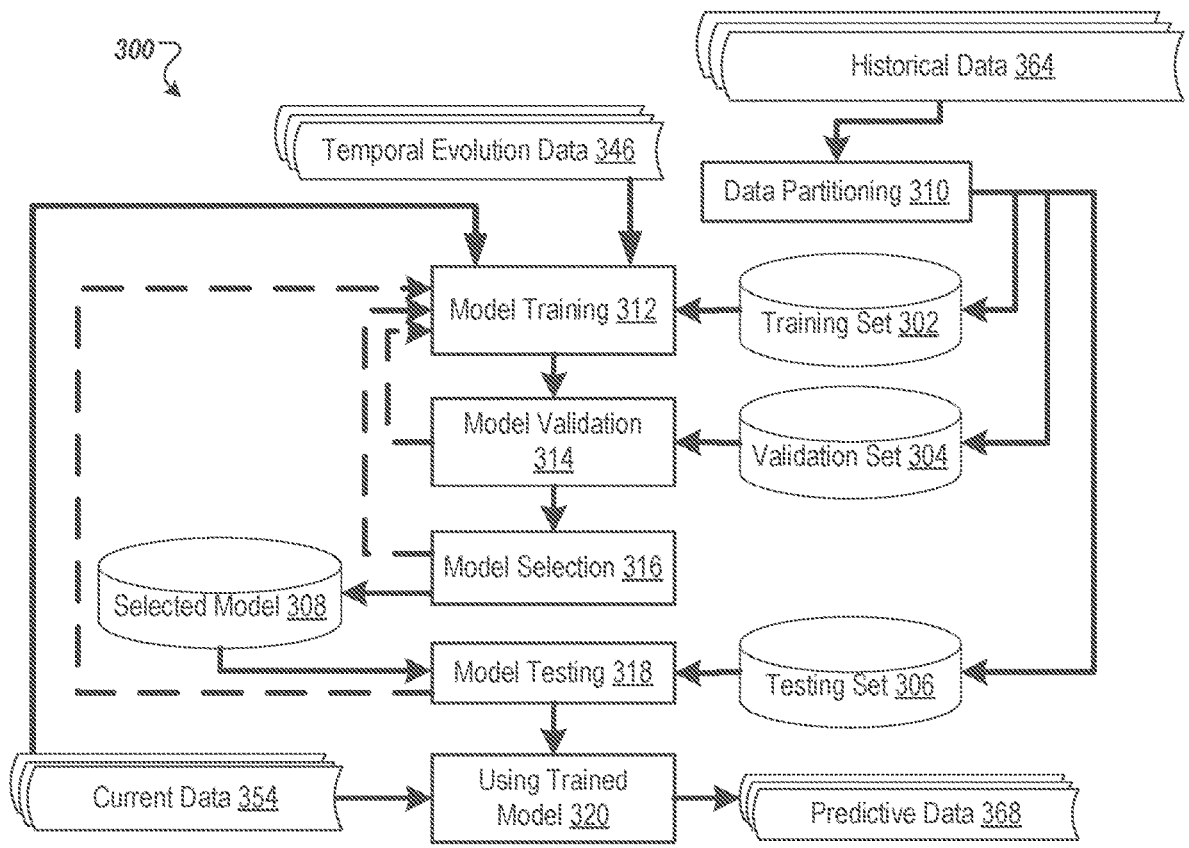

FIG. 3 is a block diagram illustrating system 300 for generating output data (e.g., predictive data 168 of FIG. 1), according to some embodiments. System 300 may be used to analyze multidimensional sensor data associated with one or more processing operations, and output an indication of temporal evolution of processing parameters through a duration of the processing operation. A system similar to system 300 may be used for other models, such as a machine learning model that receives multidimensional sensor data and generates indications of predicted anomalies, suggested corrective actions, etc. Some or all of the operations of system 300 may be used to generate data indicative of evolution of one or more substrate and/or processing parameters via a physics-based model. In these cases, other data may be used as input and produced as output by system 300, as appropriate.

Referring to FIG. 3, at block 310, the system 300 (e.g., components of predictive system 110 of FIG. 1) performs data partitioning (e.g., via data set generator 172 of server machine 170 of FIG. 1) of historical data 364 (e.g., historical multidimensional sensor data, historical substrate property evolution data, etc.) to generate training set 302, validation set 304, and testing set 306. For example, the training set may be 60% of the data, the validation set may be 20% of the data, and the testing set may be 20% of the data.

At block 312, system 300 performs model training (e.g., via training engine 182 of FIG. 1) using the training set 302.

System 300 may train one model or may train multiple models using multiple sets of features of the training set 302 (e.g., a first set of features including a subset of multidimensional data of the training set 302, a second set of features including a different subset of multidimensional sensor data of the training set 302, etc.). For example, system 300 may train a machine learning model to generate a first trained machine learning model using the first set of features in the training set and to generate a second trained machine learning model using the second set of features in the training set (e.g., different data than the data used to train the first machine learning model). In some embodiments, the first trained machine learning model and the second trained machine learning model may be combined to generate a third trained machine learning model (e.g., which may be a better predictor than the first or the second trained machine learning model on its own). In some embodiments, sets of features used in comparing models may overlap (e.g., one model may be trained with multidimensional sensor data associated with a first set of wavelengths of optical reflectance data, and another model with multidimensional sensor data indicative of a second set of wavelengths of optical reflectance data where the second set includes one or more wavelengths in the first set, different models may be trained with data from different locations of a substrate, etc.). In some embodiments, hundreds of models may be generated including models with various permutations of features and combinations of models.

At block 314, the system 300 performs model validation (e.g., via validation engine 184 of FIG. 1) using the validation set 304. System 300 may validate each of the trained models using a corresponding set of features of the validation set 304. For instance, validation set 304 may use the same subset of performance data used in training set 302, but for different input conditions. In some embodiments, the system 300A may validate hundreds of models (e.g., models with various permutations of features, combinations of models, etc.) generated at block 312. At block 314, the system 300 may determine an accuracy of each of the one or more trained models (e.g., via model validation) and may determine whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. The system 300 may discard the trained machine learning models that have an accuracy that is below the threshold accuracy (e.g., based on the validation set).

At block 316, system 300 may perform model selection (e.g., via selection engine 185 of FIG. 1) to determine which of the one or more trained models that meet the threshold accuracy has the highest accuracy (e.g., the selected model 308, based on the validating of block 314). Operations of block 316 may be skipped, e.g., if only one model was trained. Responsive to determining that two or more of the trained models that meet the threshold accuracy have the same accuracy, flow may return to block 312 where the system 300 performs model training using further refined training sets corresponding to further refined sets of features for determining a trained model that has the highest accuracy.

At block 318 system 300 performs model testing (e.g., via testing engine 186 of FIG. 1) using the testing set 306 to test the selected model 308. The system 300 may test, using the first set of features in the testing set, the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where the system 30A performs model training (e.g., retraining) using different training sets possibly corresponding to different sets of features or a reorganization of substrates split into training, validation, and testing sets. Responsive to determining that the selected model 308 has an accuracy that meets a threshold accuracy based on the testing set 306, flow continues to block 320. In at least block 312, the model may learn patterns in the multidimensional sensor data to make predictions and in block 318, the system 300 may apply the model on the remaining data (e.g., testing set 306) to test the predictions.

At block 320, system 300 uses the trained model (e.g., selected model 308) to receive current data 354 (e.g., current multidimensional sensor data associated with a substrate not included in historical data 364) and determines (e.g., extracts), from the output of the trained model, predictive data 368 (e.g., predictive data 168 of FIG. 1). In some embodiments, predictive data 368 is indicative of an action, e.g., may include a recommendation to perform a corrective action (e.g., perform a corrective action in association with manufacturing equipment 124 of FIG. 1, provide and alert to client device 120 of FIG. 1, etc.).

In some embodiments, retraining of the machine learning model occurs by supplying additional data to further train the model. Current data 354 may be provided at block 312. Additional temporal evolution data 346 (e.g., data indicative of evolution through a duration of a processing operation of properties such as etch depth, etch rate, deposition rate, etc.) may be provided as well. These data may be different from the data originally used to train the model by incorporating combinations of input parameters not part of the original training, input parameters outside the parameter space spanned by the original training, or may be updated to reflect chamber specific knowledge (e.g., differences from an ideal chamber due to manufacturing tolerance ranges, aging components, etc.). Selected model 308 may be retrained based on this data.

In some embodiments, one or more of the acts 310-320 may occur in various orders and/or with other acts not presented and described herein. In some embodiments, one or more of acts 310-320 may not be performed. For example, in some embodiments, one or more of data partitioning of block 310, model validation of block 314, model selection of block 316, or model testing of block 318 may not be performed. In training a physics-based model, e.g., to take as input multidimensional sensor data and produce as output predicted temporal evolution of one or more processing parameters, a subset of these operations may be performed.

Figure 4A:
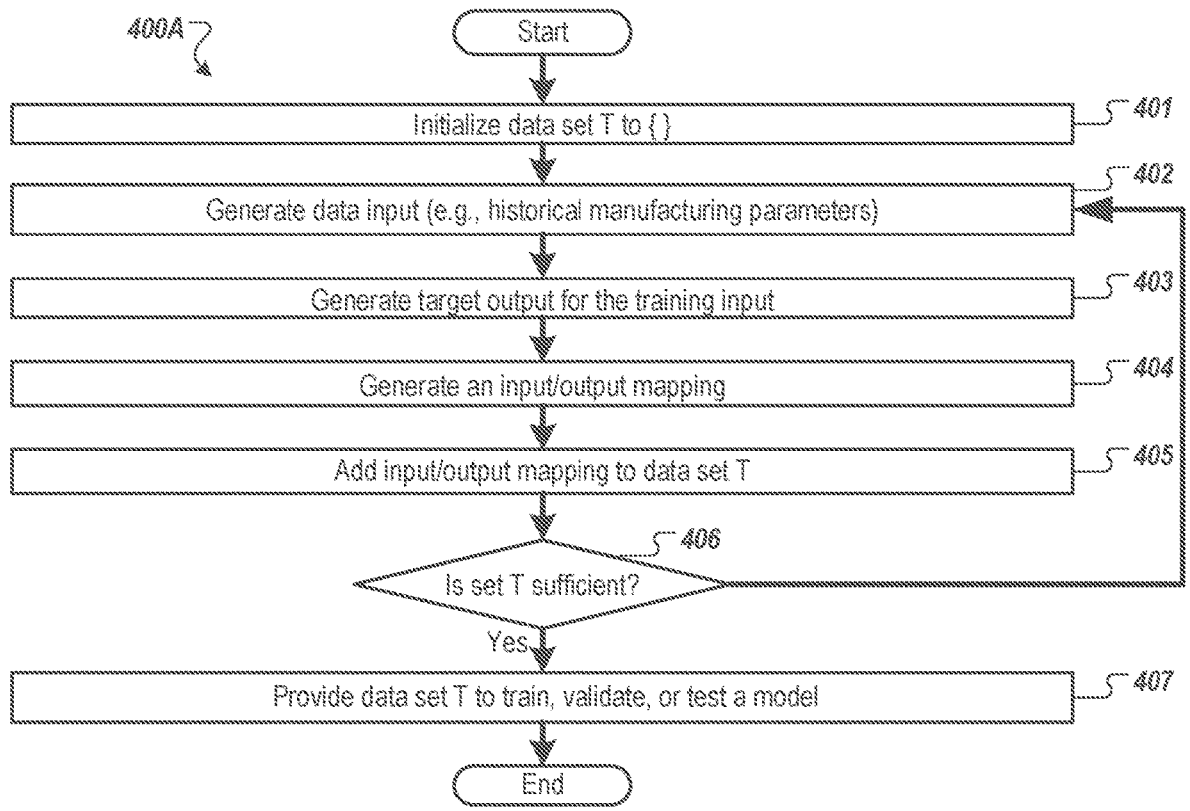
Figure 4B:
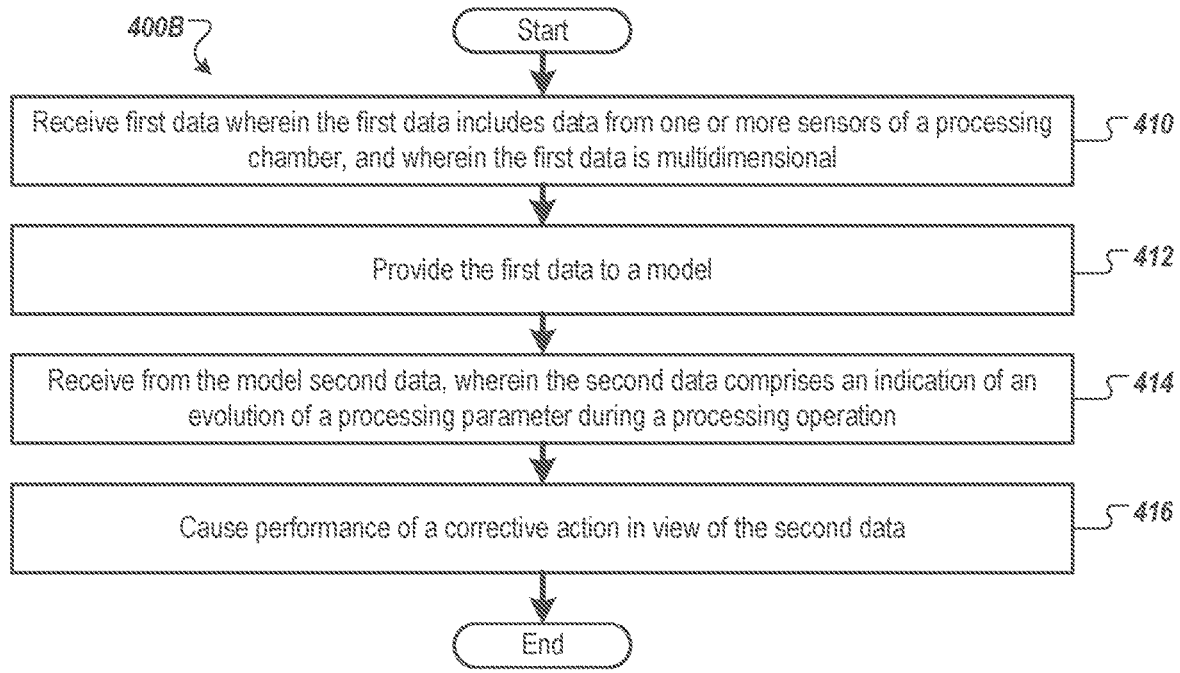
Figure 4C:
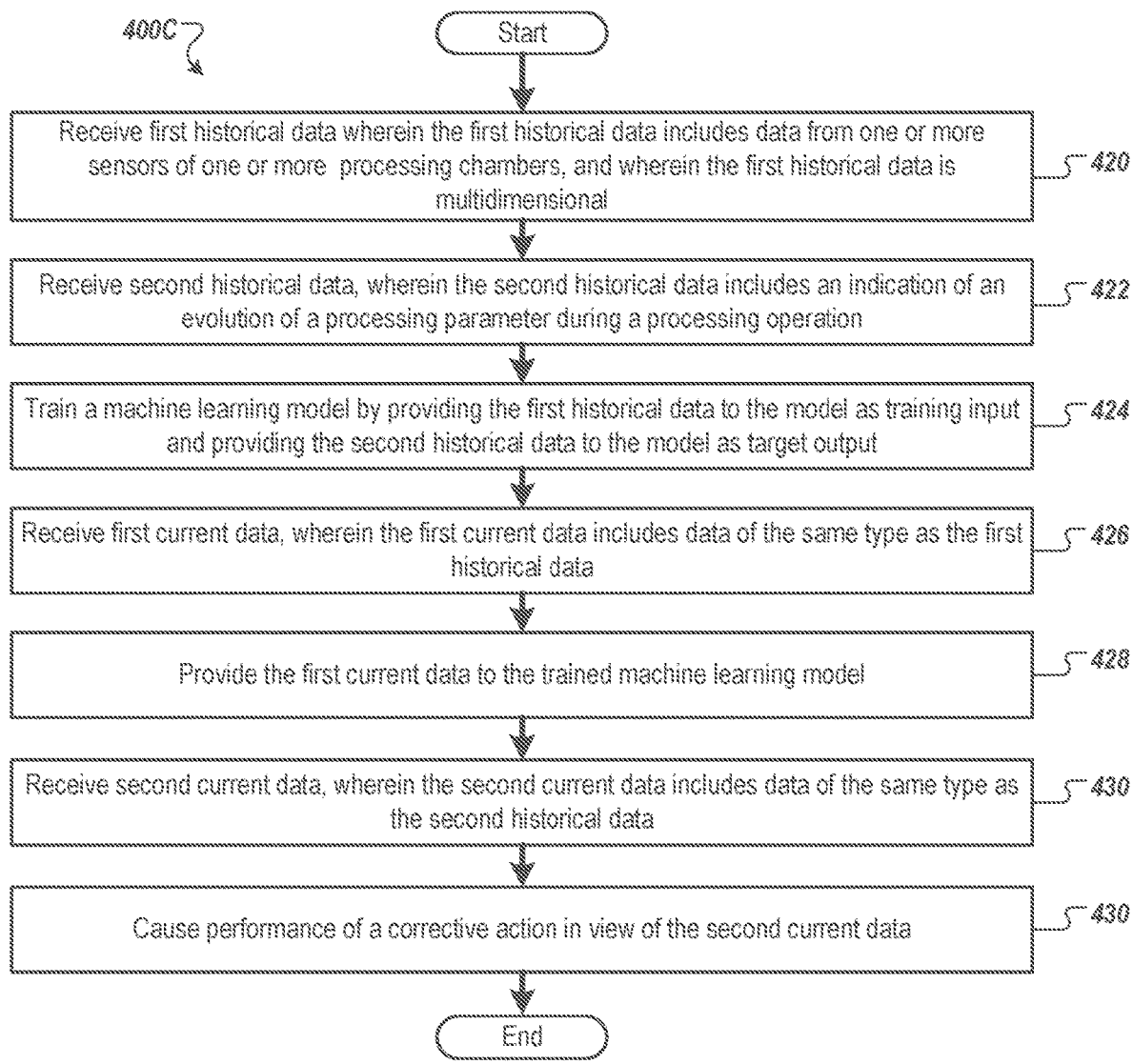

FIGS. 4A-C are flow diagrams of methods 400A-C associated with analysis of multidimensional sensor data, according to some embodiments. Methods 400A-C may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiment, methods 400A-C may be performed, in part, by predictive system 110. Method 400A may be performed, in part, by predictive system 110 (e.g., server machine 170 and data set generator 172 of FIG. 1, data set generator 272 of FIG. 2). Predictive system 110 may use method 400A to generate a data set to at least one of train, validate, or test a model, in accordance with embodiments of the disclosure. The model may be a physics-based digital twin model (e.g., to generate predictive performance data of a substrate support), a machine learning model (e.g., to generate predictive performance data of a wafer, to generate data indicative of a corrective action associated with a component of manufacturing equipment, etc.), a statistical model, or another model trained to receive input and generate output related to substrate support characterization. Method 400B may be performed by predictive server 112 (e.g., predictive component 114, etc.). Method 400C may be performed by server machine 180 (e.g., training engine 182). In some embodiments, a non-transitory storage medium stores instructions that when executed by a processing device (e.g., of predictive system 110, of server machine 180, of predictive server 112, etc.) cause the processing device to perform one or more of methods 400A-C.

For simplicity of explanation, methods 400A-C are depicted and described as a series of operations. However, operations in accordance with this disclosure can occur in various orders and/or concurrently and with other operations not presented and described herein. Furthermore, not all illustrated operations may be performed to implement methods 400A-C in accordance with the disclosed subject matter. In addition, those skilled in the art will understand and appreciate that methods 400A-C could alternatively be represented as a series of interrelated states via a state diagram or events.

FIG. 4A is a flow diagram of a method 400A for generating a data set for a machine learning model for generating predictive data (e.g., predictive data 168 of FIG. 1), according to some embodiments.

Referring to FIG. 4A, in some embodiments, at block 401 processing logic implementing method 400A initializes a training set T to an empty set. At block 402, processing logic generates first data input (e.g., first training input, first validating input) that may include multidimensional sensor data, processing chamber performance data, measured substrate performance data, substrate metrology data (e.g., film properties such as thickness, material composition, optical properties, roughness, and so on), etc. In some embodiments, the first data input may include a first set of features for first types of data and a second data input may include a second set of features for second types of data (e.g., as described with respect to FIG. 3).

At block 403, processing logic generates a first target output for one or more of the data inputs (e.g., first data input). In some embodiments, the first target output includes an indication of temporal evolution of one or more processing parameters through a duration of a processing operation, e.g., etch depth, etch rate, substrate structure dimension, etc. In some embodiments, the first target output is performance data of substrates. In some embodiments, the first target output includes data indicative of a corrective action. In some embodiments, no target output is generated (e.g., for training an unsupervised machine learning model)

At block 404, processing logic optionally generates mapping data that is indicative of an input/output mapping. The input/output mapping (or mapping data) may refer to the data input (e.g., one or more of the data inputs described herein), the target output for the data input, and an association between the data input(s) and the target output. In some embodiments (e.g., those without target output data) these operations may not be performed.

At block 405, processing logic adds the mapping data generated at block 404 to data set T, in some embodiments. At block 406, processing logic branches based on whether data set T is sufficient for at least one of training, validating, and/or testing model 190 of FIG. 1. If so, execution proceeds to block 407, otherwise, execution continues back at block 402. It should be noted that in some embodiments, the sufficiency of data set T may be determined based simply on the number of inputs, mapped in some embodiments to outputs, in the data set, while in some other implementations, the sufficiency of data set T may be determined based on one or more other criteria (e.g., a measure of diversity of the data examples, accuracy, etc.) in addition to, or instead of, the number of inputs.

At block 407, processing logic provides data set T (e.g., to server machine 180 of FIG. 1) to train, validate, and/or test model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing.

FIG. 4B is a flow diagram of a method 400B for performing temporal analysis of multidimensional sensor data, according to some embodiments. At block 410 of method 400B, processing logic receives first data. The first data includes data from one or more sensors of a processing chamber. The first data is associated with a processing operation. The first data is multidimensional, e.g., is resolved in at least two dimensions. The first data is resolved in time, e.g., one of the dimensions of the multidimensional data is time.

In some embodiments, the first data includes repeated measurements by one or more sensors through a duration (e.g., the duration of a processing operation). In some embodiments, sensor measurements may be repeated multiple times throughout a processing operation, e.g., may be repeated in multiple time steps, time frames, etc. In some embodiments, different data is collected at different frames, e.g., not every point represented in dimensions independent from the time dimensions may be represented at every data collection time. For example, multidimensional sensor data may include spectral data. In some embodiments, a first subset of wavelength measurements may be recorded at a first time step, a second subset of wavelength measurements may be recorded at a second time step, etc.

In some embodiments, first data includes in-situ measurements of a substrate in a processing chamber. As used herein, in-situ measurement indicates measurements taken during processing of a substrate, e.g., optical reflectance data recording during a processing operation. In-situ measurements may include frequency dependent measurements, e.g., spectrally resolved measurements (optical reflectance, x-ray measurements, etc.), acoustic measurements, etc.

At block 412, processing logic provides the first data to a model (e.g., model 190 of FIG. 1). In some embodiments, the model includes a physics-based model. In some embodiments, the model includes a machine learning model. At block 414, processing logic receives from the model second data. The second data includes an indication of an evolution of one or more processing parameters (e.g., etch rate, etch depth, structure geometry, deposition rate, etc.) during a processing operation (e.g., throughout the duration of a processing operation).

The model may be configured to receive as input multidimensional sensor data (e.g., data resolved in time and at least one other dimension) and fit the data simultaneously to generate an indication of evolution of a process operation, evolution of one or more dimensions of a substrate, etc. The model may be configured to treat the input data holistically, e.g., treat data from throughout the duration of a processing operation simultaneously. In some embodiments, the model may be configured to generate as output data indicative of a corrective action, e.g., adjustment to a recipe, recommended maintenance, recommended component replacement, etc. Operations of the model are discussed further in connection with FIG. 5. At block 416, processing logic causes performance of a corrective action in view of the second data. Causing performance of a collective action may include updating a process recipe, scheduling maintenance (e.g., scheduling preventative maintenance, scheduling corrective maintenance, etc.), sending an alert to a user, etc.

FIG. 4C is a flow diagram of a method 400C for utilizing a machine learning model in connection with analysis of multidimensional sensor data, according to some embodiments. At block 420, processing logic receives first historical data. The first historical data includes data from one or more sensors of one or more processing chambers. The first historical data is associated with one or more processing operations. The first historical data is multidimensional, e.g., is resolved in at least time and one other dimension. First historical data may include sensor data associated with many substrates, many processing runs, etc.

At block 422, processing logic receives second historical data. The second historical data includes an indication of an evolution of a processing parameter during a processing operation. For example, the second historical data may include data indicating a temporal evolution of etch depth, etch rate, deposition rate, geometry of a structure, etc., through the duration of a processing operation. Second data may be correlated to the first data, e.g., data indicating a link between sensor data and temporal processing parameter evolution data associated with the same substrate, same chamber, same substrate design, same process recipe, or the like may be present.

At block 424, processing logic trains a machine learning model. Training the machine learning model includes providing training input data to the machine learning model. Training the machine learning model may include providing target output data to the machine learning model. The machine learning model may be configured to receive data similar (e.g., of the same type, having the same source, etc.) to the training input data and generate data similar to the target output data. The machine learning model of method 400C may include one or more of a neural network (e.g., artificial neural network), Support Vector machine, Radial Basis Function, clustering, k-Nearest Neighbor algorithm, random forest, etc. Training a machine learning model is described in more detail in connection with FIG. 3.

At block 426, processing logic receives first current data. The first current data incudes data of the same type as the first historical data received at block 420 (e.g., multidimensional sensor data). First current data may have features in common with first data received at block 410 of FIG. 4B. At block 428, the first current data is provided to the trained machine learning model.

At block 430, processing logic receives second current data from the trained machine learning model. The second current data includes data of the same type as the second historical data received at block 422 (e.g., data indicative of temporal evolution of one or more processing parameters). Second current data may have features in common with second data received at block 414 of FIG. 4B. At block 432, processing logic causes performance of a corrective action in view of the second current data. Operations of block 432 may have features in common with operations of block 416 of FIG. 4B.

Figure 5:
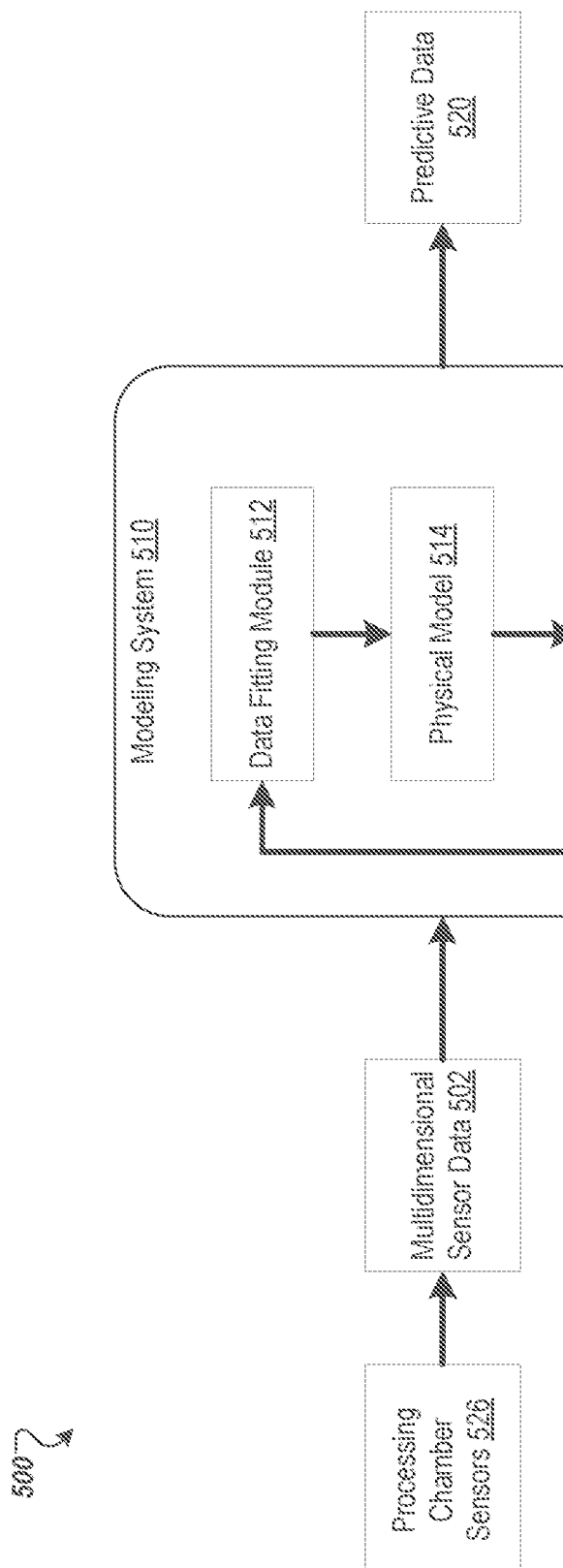

FIG. 5 depicts a data analysis system 500 for utilizing multidimensional sensor data 502 to generate predictive data 520, according to some embodiments. In some embodiments, data indicative of performance of a processing operation is generated by processing chamber sensors 526 (e.g., sensors 126 of FIG. 1). Processing chamber sensors 526 may include sensors measuring chamber temperature, chamber pressure, supplied electrical power, electrical resistance, optical properties, gas flow rate, chemical properties, acoustic properties, etc. In some embodiments, processing chamber sensors 526 include sensors receiving optical data, e.g., substrate reflectance spectra. Processing chamber sensors 526 generate multidimensional sensor data 502. Multidimensional sensor data 502 may be resolved in at least time and one other dimension. For example, data generated by an optical sensor may be resolved in frequency/wavelength, and time. As another example, pressure and temperature data may be resolved in time and sensor (e.g., sensor location, sensor ID, etc.). In some embodiments, all resolved data points in one dimension may be measured repeatedly in time. For example, spectral data may resolve signal at a number of wavelengths, and measurement of those wavelengths may be repeated several times throughout the duration of a processing operation. In some embodiments, a selection of data points may be measured at one or more time steps. For example, an acoustic sensor may cycle measured frequencies in time, such that a data point is not measured for each measureable frequency at each time step. In some embodiments, multidimensional sensor data 502 may include data from the entire duration of a processing operation, e.g., may be provided to modeling system 510 after the processing operation has concluded. In some embodiments, multidimensional sensor data 502 may include data from a portion of the duration of the processing operation.

Multidimensional sensor data 502 is provided to modeling system 510. Modeling system 510 may be included in predictive system 110 of FIG. 1, may be hosted fully or in part on predictive server 112 of FIG. 1, etc. Modeling system 510 may be configured to fit multidimensional sensor data 502 in at least two dimensions simultaneously, e.g., modeling system 510 may include components, algorithms, etc., configured to fit the time evolution of multiple data collection channels (e.g., sensors, wavelengths, frequencies, locations, etc.). Fitting multiple dimensions of multidimensional data simultaneously provides technical advantages over conventional methods. An increase in the number of data points available for fitting (e.g., due to fitting data from multiple time steps or time frames together) may increase the number of parameters that may be fit, may increase the number of physical dimensions that may be predicted, may increase certainty of process evolution (e.g., change in etch rate over the duration of a processing operation), may increase robustness of fitting procedures against noisy signals, etc. Increased available information, increased certainly, and increased ability to extract information from noisy signals may increase efficiency of data processing, e.g., fewer test operations may need to be run to indicate performance of a new recipe, new chamber, new operation, new substrate design, or the like. Reliable analytics of temporal evolution of processing parameters increases efficiency of process learning, e.g., development of new process recipes, development of new product designs, etc.

Modeling system 510 may include data fitting module 512, physical model 514, and data simulator 516. Multidimensional data may be provided to data fitting module 512. Data fitting module 512 may be configured to receive as input multidimensional sensor data and generate as output a description of the data, e.g., a fit, a functional form, etc. Data fitting module 512 may generate output using a regression model, a rule-based model, etc. Data fitting module 512 may fit the values of one or more parameters in view of the input data. Data fitting module 512 may fit multiple values over time, e.g., response over time from multiple sensors, response over time of multiple properties measured by a sensor (e.g., optical wavelength, acoustic frequency, etc.), or the like.

Output of data fitting module 512 may be provided to physical model 514. Physical model 514 may be configured to accept data (e.g., fitted parameter values from data fitting module 512) and generate an indication of properties of a manufactured device. For example, physical model 514 may accept fitted parameters from fitting module 512 and generate an indication of evolution of substrate metrology over the duration of a processing operation. Physical model 514 may express the evolution of multiple properties over time. For example, physical model 514 may express evolution of etch depth, etch width, deposition depth, structure dimension, or the like, over a time duration (e.g., the duration of the processing operation associated with multidimensional sensor data 502).

Data indicative of predicted physical system evolution (e.g., output of physical model 514) may be provided to data simulator 516. Data simulator 516 may be configured to generate synthetic sensor data in accordance with a physical model. Data simulator 516 may incorporate a model of a physical object (e.g., substrate) interacting with a medium (e.g., electromagnetic radiation). Data simulator 516 may include a digital twin model. As used herein, a digital twin is a digital replica of a physical asset, such as a manufactured part or substrate. The digital twin includes characteristics of the physical asset, such as coordinate axes dimensions, weight characteristics, material characteristics (e.g., density, surface roughness), optical characteristics (e.g., reflectivity), etc. In some embodiments, data simulator 516 may solve equations with physical meaning (e.g., systems of equations describing the interaction of structures and radiation) to generate synthetic sensor data. In some embodiments, output of data simulator 516 may be provided to fitting module 512. Predictions may be improved recursively until sufficient accuracy is reached (e.g., until solutions converge within a threshold value). Modeling system 510 may then output predictive data 520. Predictive data 520 may share features with predictive data 168 of FIG. 1. Predictive data may include a description of predicted evolution of substrate parameters over the duration of the processing operation. For example, predictive data 520 may include an indication of etch depth evolution over the duration of a processing operation.

In some embodiments, functions of system 500 may be performed by one or more machine learning models. In some embodiments, functions of modeling system 510 may be performed by one or more machine learning models. In some embodiments, modeling system 510 may be replaced with a machine learning model. The machine learning model may be trained in a supervised manner (e.g., trained using labeled training data). The machine learning model may be trained in a semi-supervised manner (e.g., trained using some labeled training data and some unlabeled training data). The machine learning model may be provided with sensor data as training input and provided with labels indicative of substrate metrology (e.g., etch depth, deposition depth, etc.) as target output. In operation, The trained machine learning model may be provided with multidimensional sensor data 502 and generate as output predictive data 520.

In some embodiments, physical model 514 may be replaced with a machine learning model. In training, the machine learning model may be provided with fit data (e.g., fit parameters generated from multidimensional sensor data 502) as training input and provided with indications of one or more substrate dimensions (e.g., etch depth) as target output. In operation, the machine learning model may receive fit output from fitting module 512 and generate as output a prediction of physical dimensions of a substrate. Other operations of system 500 may instead be replaced with machine learning models, with corresponding changes to training input and target output provided in training operations and input provided and output generated in model operation.

Figure 6:
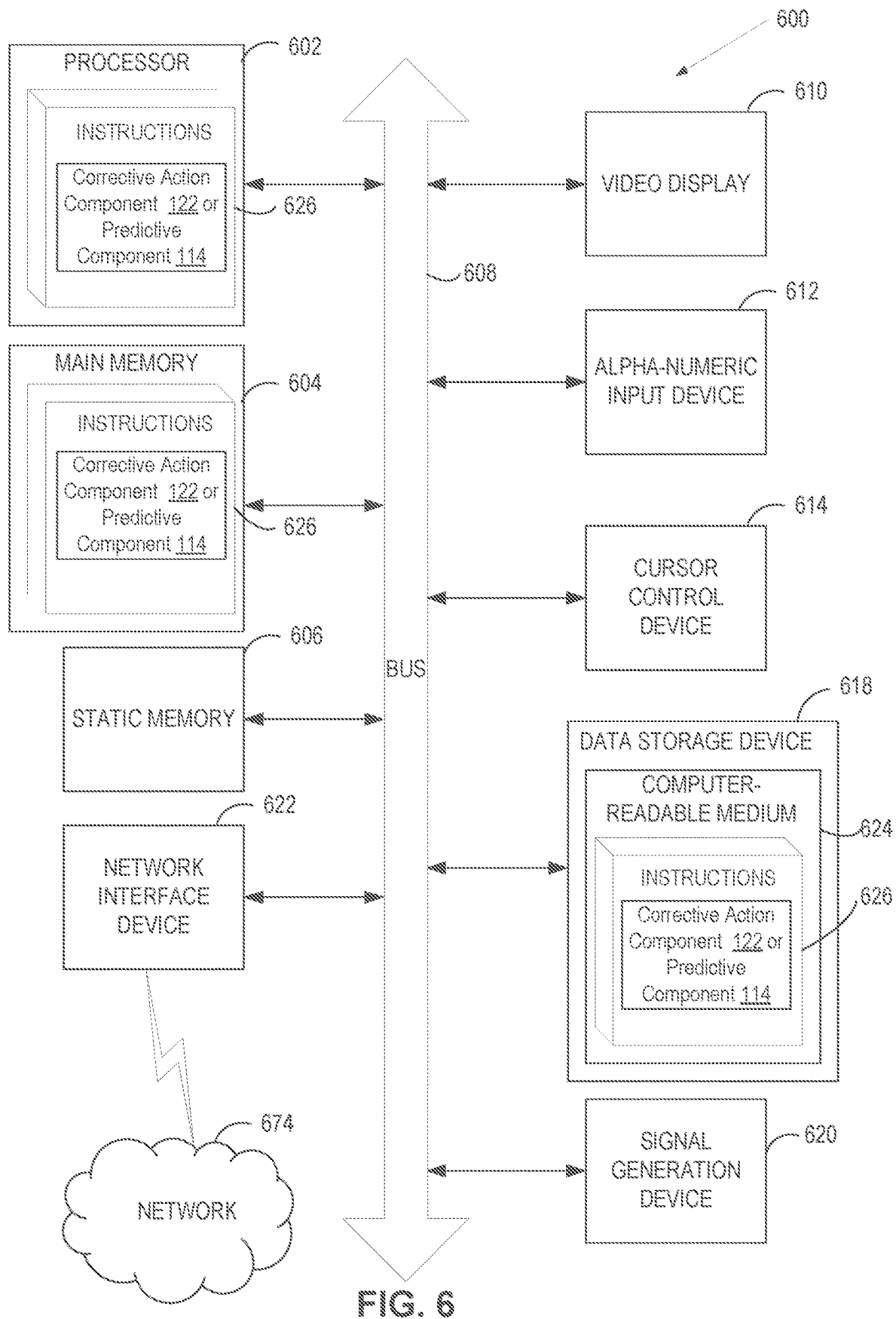

FIG. 6 is a block diagram illustrating a computer system 600, according to some embodiments. In some embodiments, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a Set-Top Box (STB), a Personal Digital Assistant (PDA), a cellular telephone, a web appliance, a server, a network router, switch or bridge, cloud-based computational device, virtual computing devices, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, computer system 600 may include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 618, which may communicate with each other via a bus 608.

Processing device 602 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 may further include a network interface device 622 (e.g., coupled to network 674). Computer system 600 also may include a video display unit 610 (e.g., an LCD), an alphanumeric input device 612 (e.g., a keyboard), a cursor control device 614 (e.g., a mouse), and a signal generation device 620.

In some implementations, data storage device 618 may include a non-transitory computer-readable storage medium 624 (e.g., non-transitory machine-readable storage medium) on which may store instructions 626 encoding any one or more of the methods or functions described herein, including instructions encoding components of FIG. 1 (e.g., predictive component 114, model(s) 190, etc.) and for implementing methods described herein.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "causing," "accessing," "determining," "adding," "using," "training," "generating," "identifying," "assigning," "updating," "scheduling," "correcting," or the like, refer to actions and processes performed or implemented by computer systems that manipulate and transform data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method, comprising:
   receiving, by a processing device, first data, wherein the first data comprises data generated by one or more sensors of a processing chamber associated with a processing operation and indicative of a first property of a substrate, and wherein the first data is multi-dimensional data comprising at least two dimensions, wherein one of the at least two dimensions is time;
   providing the first data as input to a model, wherein the model is configured to fit a temporal evolution of the first data over a duration associated with the processing operation;
   obtaining second data as output of the model, wherein the second data comprises an indication of an evolution of a processing parameter comprising the first property of the substrate during the processing operation;
   determining, based on the second data, that a temporal evolution of the first property is indicative of a corrective action to be performed; and
   causing performance of the corrective action in view of the second data, wherein causing performance of the corrective action comprises one or more of:
   updating a process recipe associated with the substrate;
   scheduling corrective maintenance of the processing chamber; or
   scheduling preventative maintenance of the processing chamber.

2. The method of claim 1, wherein the first data comprises in-situ measurements of a substrate in the processing chamber.

3. The method of claim 1, wherein the at least two dimensions comprise frequency of a signal.

4. The method of claim 1, wherein the first data comprises spectrally resolved data associated with detecting electromagnetic radiation.

5. The method of claim 1, wherein the model comprises a physics-based model, and wherein the model is configured to fit parameters to a multi-dimensional fit function.

6. The method of claim 1, wherein the model comprises a trained machine learning model.

7. The method of claim 6, further comprising:
   receiving first historical data, wherein the first historical data is of the same type as the first data;
   receiving second historical data, wherein the second historical data is of the same type as the second data; and
   training the machine learning model by providing the first historical data as training input and the second historical data as target output.

8. The method of claim 1, wherein causing performance of the corrective action in view of the second data comprises:
   providing a user interface that presents the indication of the evolution of the processing parameter during the processing operation;

receiving, via the user interface, user input; and
determining the corrective action based on the user input.

9. The method of claim 1, wherein the process parameter comprises an etch rate or a deposition rate.

10. A system, comprising memory and a processing device coupled to the memory, wherein the processing device is to:
receive first data, wherein the first data comprises data from one or more sensors of a processing chamber associated with a processing operation and indicative of a first property of a substrate, and wherein the first data is multi-dimensional data comprising at least two dimensions, wherein one of the at least two dimensions is time;
provide the first data to a model;
receive, from the model, second data, wherein the second data comprises an indication of an evolution of a processing parameter comprising the first property of the substrate during the processing operation;
determine, based on the second data, that a temporal evolution of the first property is indicative of a corrective action to be performed; and
cause performance of the corrective action in view of the second data, wherein causing performance of the corrective action comprises one or more of:
updating a process recipe associated with the substrate;
scheduling corrective maintenance of the processing chamber; or
scheduling preventative maintenance of the processing chamber.

11. The system of claim 10, wherein the first data comprises in-situ measurements of a substrate in the processing chamber.

12. The system of claim 10, wherein one of the at least two dimensions comprises frequency.

13. The system of claim 10, wherein the first data comprises data associated with spectrally resolved detection of electromagnetic radiation.

14. The system of claim 10, wherein the model comprises a physics-based model, and wherein the model fits a temporal evolution of the first data over a duration associated with the processing operation.

15. The system of claim 14, wherein the processing device is further to:
receive first historical data, wherein the first historical data is of the same type as the first data;
receive second historical data, wherein the second historical data is of the same type as the second data; and
training a machine learning model by providing the first historical data as training input and the second historical data as target output.

16. The system of claim 10, wherein the process parameter comprises an etch rate or a deposition rate.

17. A non-transitory machine-readable storage medium storing instructions which, when executed, cause a processing device to perform operations comprising:
receiving first data, wherein the first data comprises data generated by one or more sensors of a processing chamber associated with a processing operation and indicative of a first property of a substrate, and wherein the first data is multi-dimensional data comprising at least two dimensions, wherein one of the at least two dimensions is time;
providing the first data to a model;
receiving, from the model, second data, wherein the second data comprises an indication of an evolution of a processing parameter comprising the first property of the substrate during the processing operation;
determining, based on the second data, that a temporal evolution of the first property is indicative of a corrective action to be performed; and
causing performance of the corrective action in view of the second data, wherein causing performance of the corrective action comprises one or more of:
updating a process recipe associated with the substrate;
scheduling corrective maintenance of the processing chamber; or
scheduling preventative maintenance of the processing chamber.

18. The non-transitory machine-readable storage medium of claim 17, wherein the first data comprises in-situ measurements of a substrate in the processing chamber.

19. The non-transitory machine-readable storage medium of claim 17, wherein the first data comprises spectrally resolved data associated with detecting electromagnetic radiation.

20. The non-transitory machine-readable storage medium of claim 17, wherein the model comprises a physics-based model, and wherein the model fits a temporal evolution of the first data over a duration associated with the processing operation.

* * * * *